(12) United States Patent
Zhang et al.

(10) Patent No.: US 8,310,031 B2
(45) Date of Patent: Nov. 13, 2012

(54) SEMICONDUCTOR AND SOLAR WAFERS

(75) Inventors: Guoqiang David Zhang, Ballwin, MO (US); Roland R. Vandamme, Wentzville, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 159 days.

(21) Appl. No.: 12/847,011

(22) Filed: Jul. 30, 2010

(65) Prior Publication Data

US 2012/0025353 A1  Feb. 2, 2012

(51) Int. Cl.
*H01L 29/06* (2006.01)
(52) U.S. Cl. .................... 257/618; 257/E29.02
(58) Field of Classification Search .................. 257/618, 257/347, 730, E29.02, 48, 797
See application file for complete search history.

(56) References Cited

U.S. PATENT DOCUMENTS

| | | | |
|---|---|---|---|
| 5,344,524 A | 9/1994 | Sharma et al. | |
| 5,834,812 A | 11/1998 | Golland et al. | |
| 6,431,961 B1 | 8/2002 | Katayama et al. | |
| 6,534,384 B2 | 3/2003 | Nakano et al. | |
| 7,442,992 B2 | 10/2008 | Tomita et al. | |
| 7,666,741 B2 | 2/2010 | Li et al. | |
| 7,704,126 B2 | 4/2010 | Mattes et al. | |
| 2005/0161808 A1 | 7/2005 | Anderson | |
| 2006/0055003 A1 | 3/2006 | Tomita et al. | |
| 2009/0203167 A1 | 8/2009 | Mitani | |

FOREIGN PATENT DOCUMENTS

| | | |
|---|---|---|
| EP | 1887612 A1 | 2/2008 |
| JP | 61256621 A | 11/1986 |
| JP | 1227441 A | 9/1989 |
| JP | 4085827 A | 3/1992 |

OTHER PUBLICATIONS

International Search Report and Written Opinion of the International Searching Authority mailed on Oct. 4, 2011 regarding PCT/IB2011/053284 filed on Jul. 22, 2011; 9 pages.

*Primary Examiner* — Thomas L Dickey
*Assistant Examiner* — Nikolay Yushin
(74) *Attorney, Agent, or Firm* — Armstrong Teasdale LLP (57) ABSTRACT

A silicon-on-insulator or bonded wafer includes an upper portion having a trapezoid shape in cross-section and a lower portion having an outer peripheral edge having a curved shape.

19 Claims, 13 Drawing Sheets

SEMICONDUCTOR AND SOLAR WAFERS

FIELD

This disclosure relates to semiconductor and solar wafers such as silicon on insulator (SOI) bonded structures, and more particularly to a bonded SOI wafer and a method for manufacturing a bonded SOI wafer.

BACKGROUND

Semiconductor wafers are generally prepared from a single crystal ingot (e.g., a silicon ingot) which is sliced into individual wafers. While reference will be made herein to semiconductor wafers constructed from silicon, other materials may be used as well, such as germanium, gallium arsenide or other materials described below. One type of wafer is a silicon-on-insulator (SOI) wafer. An SOI wafer includes a thin layer of silicon (an active layer) atop an insulating layer (i.e., an oxide layer) which is in turn disposed on a silicon substrate. A bonded SOI semiconductor wafer is a type of SOI structure.

Due to device width shrink, power conservation, superhigh speed performance, and/or special applications in electronic industry, the demands on SOI (silicon on insulator) wafers are increasing. One challenge is to effectively remove the unbonded outer peripheral portion of an active layer wafer bonded to the support substrate in order to avoid delamination. Delamination can result in particle contamination in the process and/or device lines of the wafer.

When manufacturing an SOI wafer, outer peripheral portions of the two wafers to be bonded are subjected to R or T chamfering, or edge profiling (as further described below), in order to prevent wafer breakage, cracks and/or particle generation. Also, outer peripheral portions of a bonded substrate have uneven thickness due to wafering steps. Because of this uneven thickness, during the bonding process, the outer peripheral portion is either not bonded at all and/or weakly bonded. When an active wafer thickness is reduced with processes such as grinding, etching, polishing, etc., this unbonded portion is partially delaminated from the bonded substrate during the film thickness reducing processes. The delaminated parts cause problems for film thickness reduction, cleaning, and measurement processes. Furthermore, in device processes, the remaining unbonded portions are delaminated, which causes particle generation and severely impacts device yields.

Figure 1A:
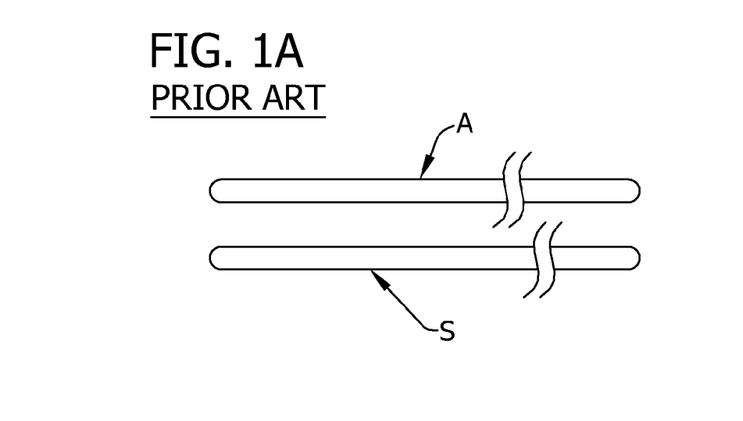
Figure 1B:
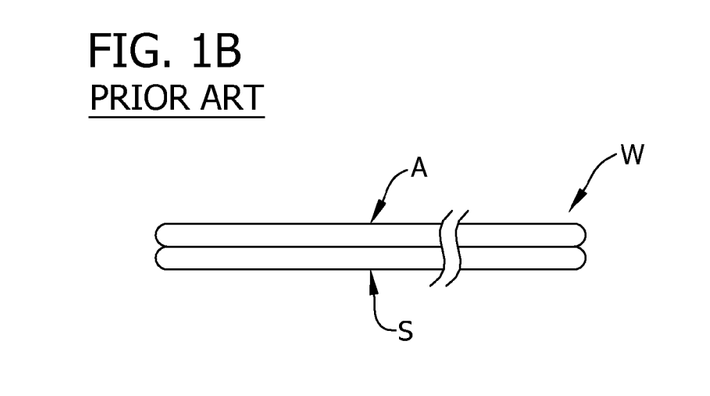
Figure 1C:
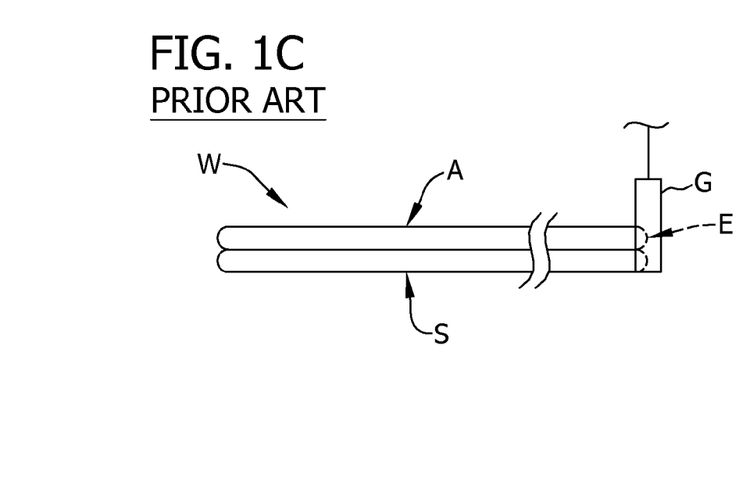
Figure 1D:
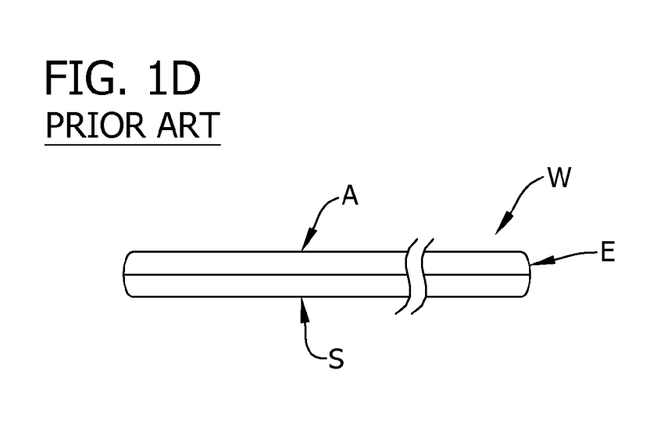

There have been several prior art attempts to solve delamination. For example, FIGS. 1A-1D show a progression of steps for bonding a substrate wafer S and an active layer wafer A to each other and then chamfering the edge peripheral portion of the bonded wafer W. FIG. 1A shows the substrate below the active layer wafer, and FIG. 1B shows the bonded wafers. FIG. 1C shows a grinder G grinding the outer peripheral edges of the wafers, and FIG. 1D shows the complete SOI wafer W (note that the complete wafer is further processed). This method is believed to be substantively similar to that shown in Japanese Patent Application No. 1986-256621. Among other drawbacks of this example, the diameter of the wafer W is smaller than the standard wafer diameter, which causes problems for the downstream handling facilities and jigs.

Figure 2A:
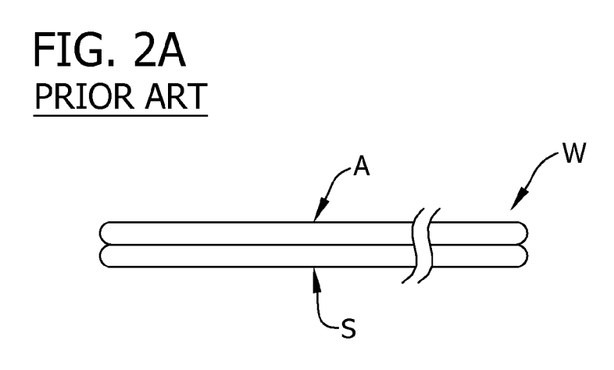
Figure 2B:
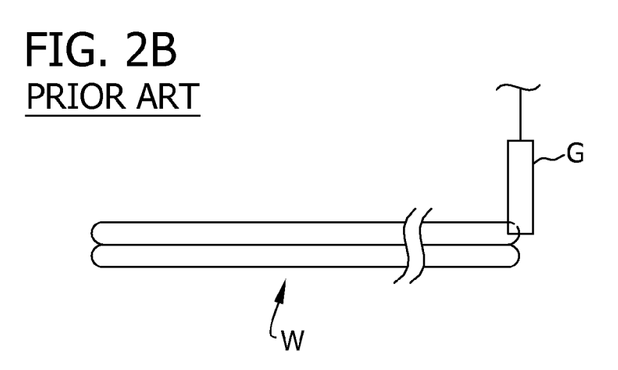
Figure 2C:
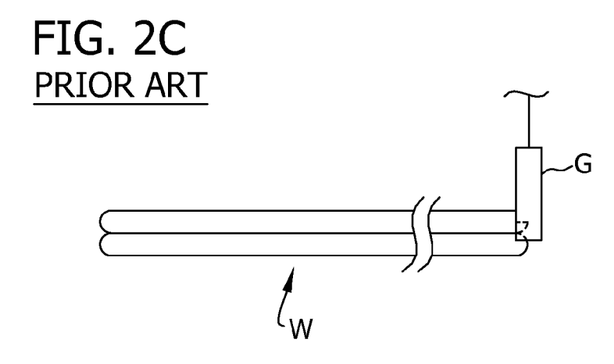
Figure 2D:
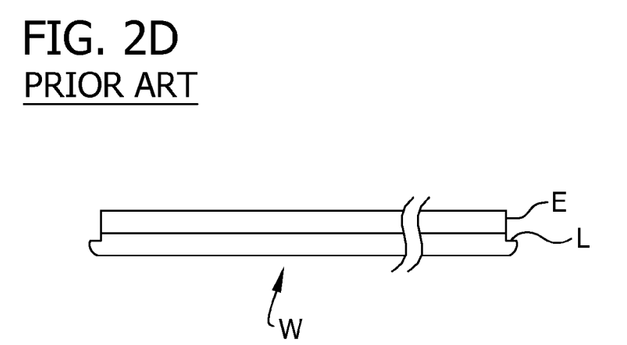

In another prior art example shown in FIGS. 2A-2D, a bonded SOI wafer W is formed as described above from an active layer wafer A and a substrate wafer S. The wafer edges are ground as shown in FIGS. 2B-2C such that the entire outer edge of the active wafer A is ground off, but only a portion of substrate is ground off. This method is believed to be substantively similar to that shown in Japanese Patent Application No. 1989-227441. This method suffers from poor efficiency.

Figure 3A:
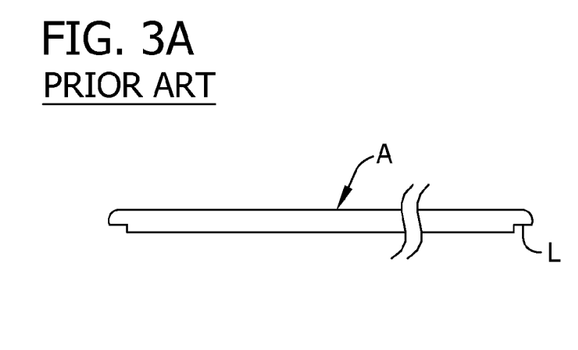
Figure 3B:
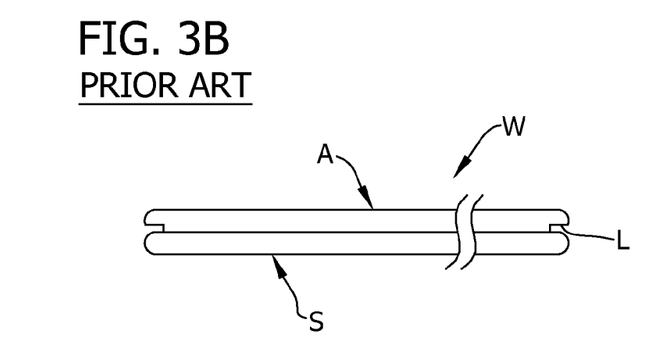
Figure 3C:
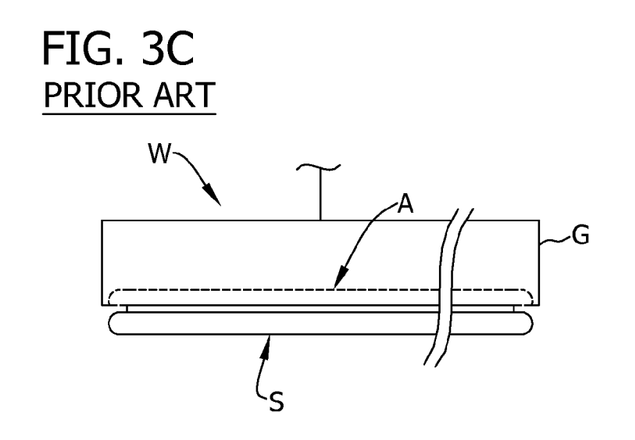
Figure 3D:
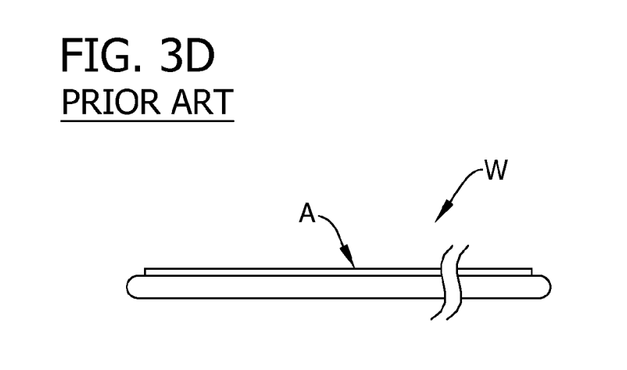

In the prior art example shown in FIG. 3A, the active wafer A is ground at its edges to form a ledge L (wafer A is thus a pre-ground wafer). The wafer A is bonded to substrate wafer S in FIG. 3B. In FIG. 3C, the top surface of the bonded SOI wafer W is ground to remove the ledge L, and the complete wafer is shown in FIG. 3D. The unbonded portion of the active layer wafer can thereafter be ground down. This method is believed to be substantively similar to that shown in Japanese Patent Application No. 1992-85827.

Figure 4A:
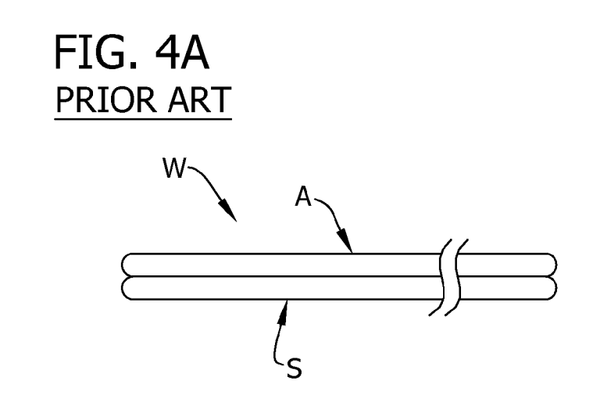
Figure 4B:
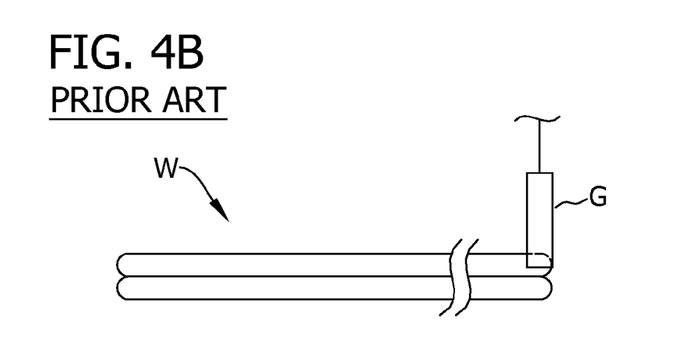
Figure 4C:
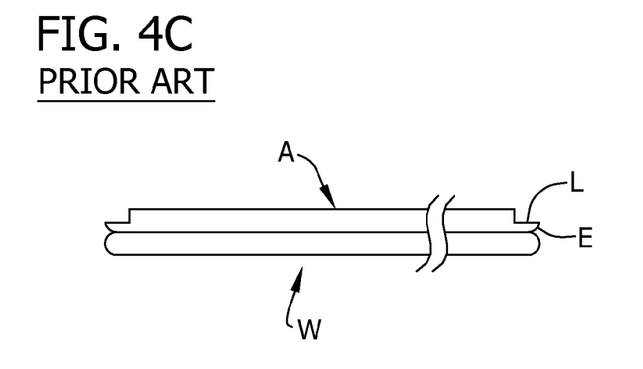
Figure 4D:
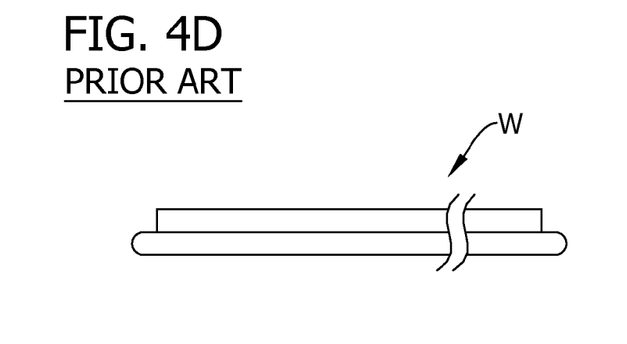

In prior art FIG. 4A, a bonded SOI wafer W is formed as described above from an active layer wafer A and a substrate wafer S. In FIG. 4B, the active wafer A is ground at its upper peripheral edge E to form the ledge L shown in FIG. 4C. To complete the wafer processing of FIG. 4D, selective etching, polishing and/or PAC (plasma assisted chemical etching) processes are used to remove the unbonded parts from the outer peripheral edge of the active layer wafer A. This method is believed to be substantively similar to that shown in U.S. Pat. No. 6,534,384 B2, which is incorporated herein by reference. As can be seen, many steps are required to form the complete wafer.

Figure 5A:
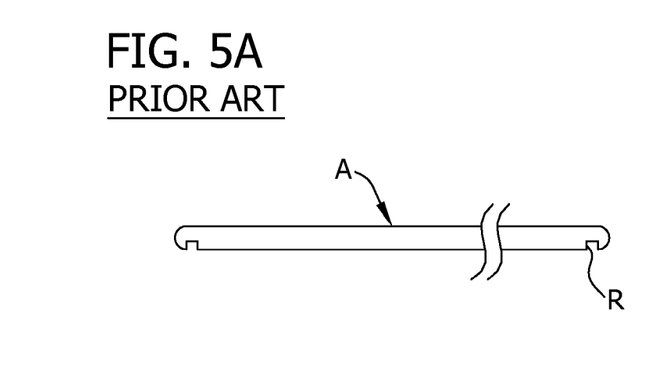
Figure 5B:
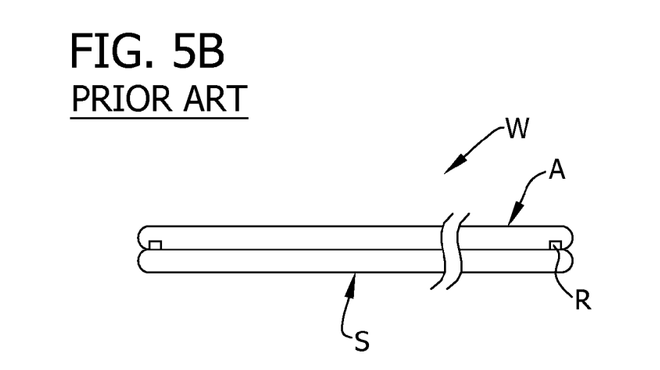
Figure 5C:
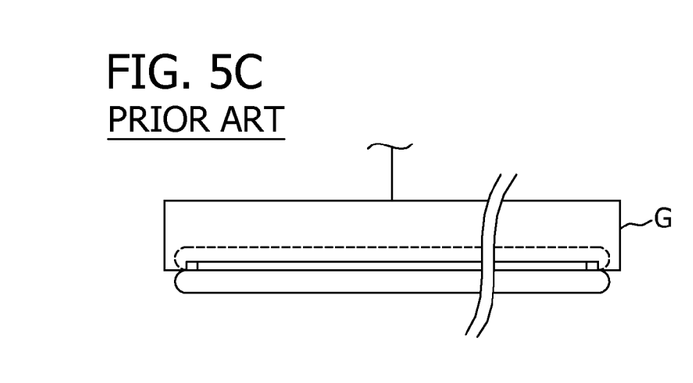
Figure 5D:
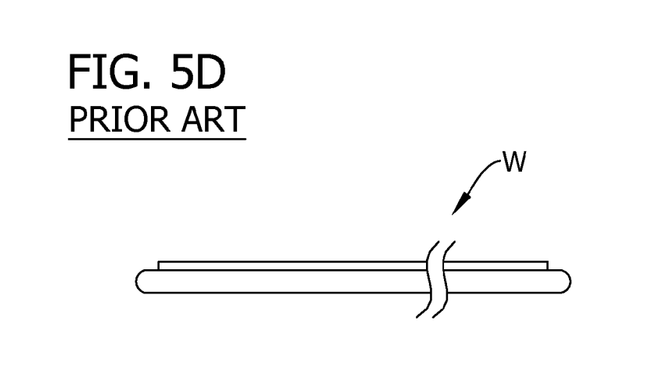

In prior art FIG. 5A, the active layer wafer A includes a groove R formed in its lower surface prior to bonding. The active wafer A is bonded to the substrate wafer S in FIG. 5B. This method is believed to be substantively similar to that shown in US Patent Application 2009/0203167 A1, which is incorporated herein by reference. In FIG. 5C, grinding is performed on wafer A on the opposite side from the groove R. The unbonded portion of the outer peripheral portion of the wafer A can be removed after grinding the wafer to predetermined thickness, as shown in the complete wafer W of FIG. 5D.

There remains an unfulfilled need for a wafer surface treatment method and a wafer that addresses the disadvantages of current methods of preventing delamination of the outer peripheral portion of an active layer of a bonded structure.

BRIEF SUMMARY

In one aspect, a silicon-on-insulator wafer comprises an upper portion having a trapezoid shape in cross-section and a lower portion having an outer peripheral edge having a curved shape.

In another aspect, a silicon-on-insulator structure comprises an active wafer and a substrate wafer, the active wafer having a trapezoid shape in cross-section and the substrate wafer having an outer peripheral edge having a curved shape.

In still another aspect, a bonded semiconductor wafer comprises an active wafer and a substrate wafer bonded to one another. The active wafer includes an outer peripheral edge including an angled shape such that the active wafer has a trapezoid shape in cross-section. An upper peripheral edge of the substrate wafer defines the lowermost portion of the trapezoid shape of the active layer wafer.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIGS. 1A-5D are side views showing prior art methods of making an SOI wafer.

The figures are not to scale, and portions are enlarged for illustrative purposes. Corresponding reference characters indicate corresponding parts throughout the figures.

DETAILED DESCRIPTION

Figure 6:
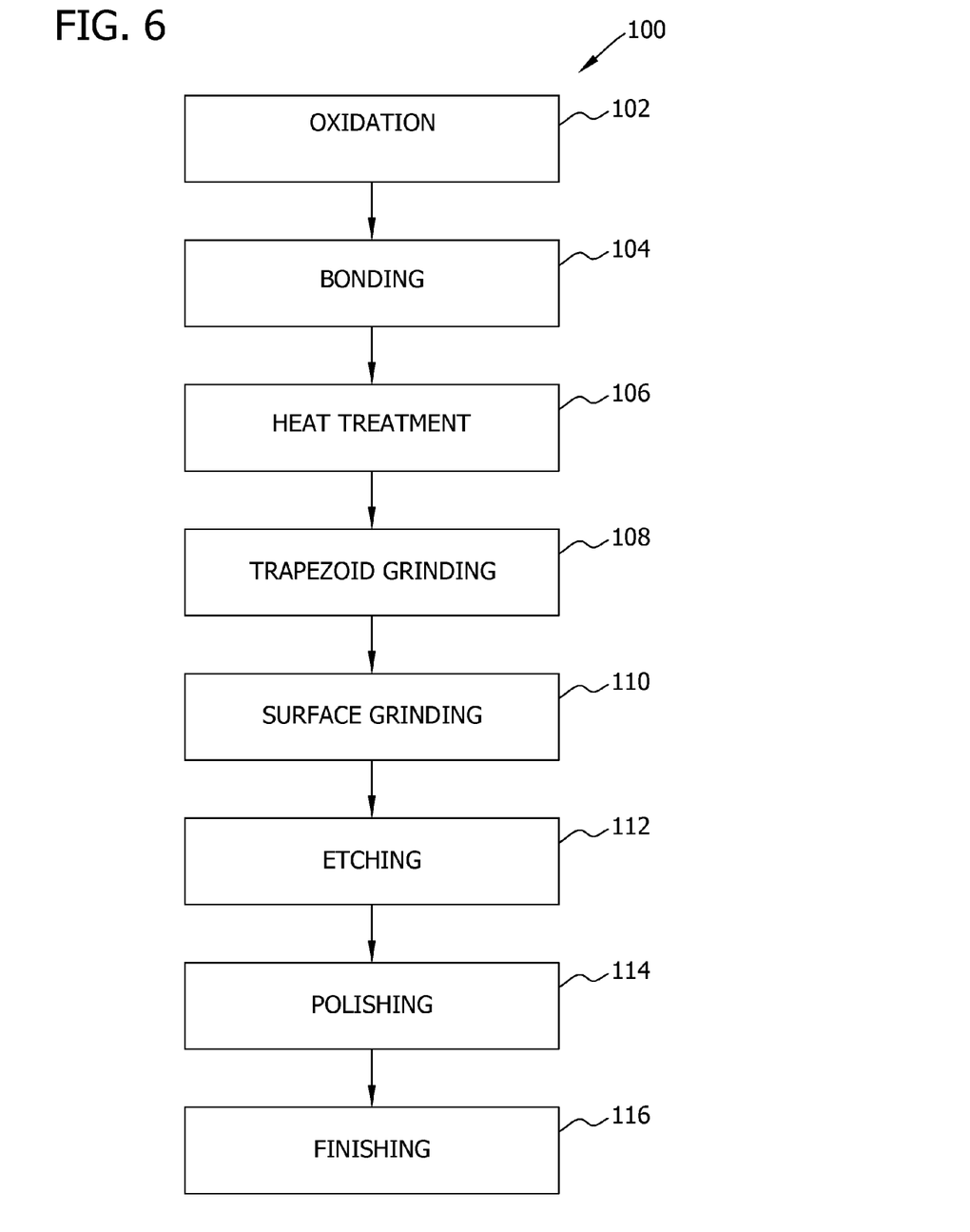
FIG. 6 is a flowchart showing a method of manufacturing an SOI wafer according to one embodiment.
Figure 7A:
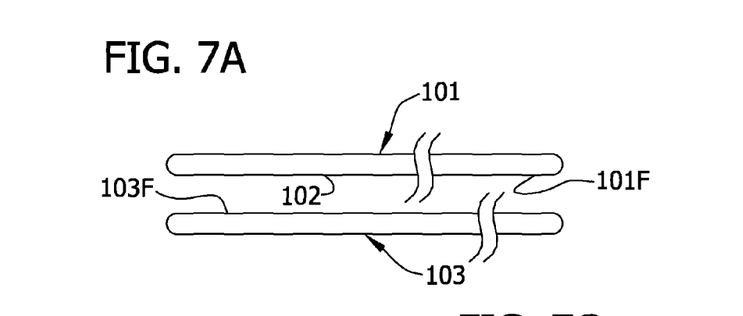
FIGS. 7A-7E are a progression of side views showing aspects of the method of manufacturing of FIG. 6.

Referring now to FIGS. 6 and to 7A-7E, a method 100 of manufacturing or processing a bonded wafer (alternatively, a silicon-on-insulator structure or SOI wafer) is shown. An active wafer 101 and a substrate wafer 103, such as those shown in FIG. 7A, are conventional wafers. Both have mirror-polished front surfaces 101F, 103F and are relatively defect-free.

Active wafer 101 and substrate wafer 103 may be any single crystal semiconductor material suitable for use in an SOI structure. In general, the wafers may be composed of a material selected from the group consisting of silicon, germanium, gallium arsenide, silicon germanium, gallium nitride, aluminum nitride, phosphorous, sapphire and combinations thereof. In one embodiment, the wafers 101, 103 are made of silicon.

Figure 7B:
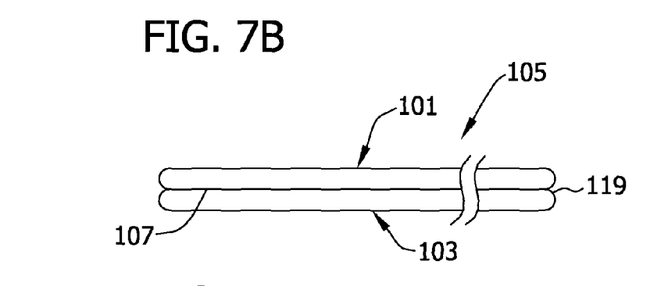

A layer of oxide 107 is deposited 102 on the front surface of the active wafer. Oxidation is typically performed in a vertical furnace, e.g. commercially available AMS400. The front surface of the wafer is then bonded 104 to the front surface of the substrate wafer to form a bonded wafer 105 as shown in FIG. 7B. Bonding can be performed in a conventional hydrophilic bonding process using a tool such as Model EVG® 850 from EV Group of Austria. Heat treatment 106 is suitably performed in an electric oven (such as model Blue M from TPS of Pennsylvania) to strengthen the bond. The next step, trapezoid grinding 108 is further described below with reference to FIG. 7C. Surface grinding 110, shown in FIG. 7D is suitably performed using a single side grinder, such as in model DFG-830 from Disco Corporation of Japan. The surface grinding 110 suitably includes a rough grinding step and a fine grinding step. Rough grinding is suitably performed using a 600 mesh with 20-30 microns grit size, and fine grinding is 3000 mesh and grit size of 2-6 microns.

Referring again to FIG. 6, etching 112 is next performed on the bonded wafer 105, and is suitably performed in a conventional etching apparatus using an alkali etchant, though an acid etchant may also be used. Polishing 114 is then performed and is suitably a single-side polishing on front surface 105F using a Strasbaugh Mark 9-K. Alternatively, the polishing 114 may be a double-side polishing of both the front surface 105F and back surface 105B. Finishing 116 of the bonded wafer 105 includes inspecting the wafer for all required parameters, such as flatness and particle count, and then packaging the wafer for shipment to customers.

Figure 7C:
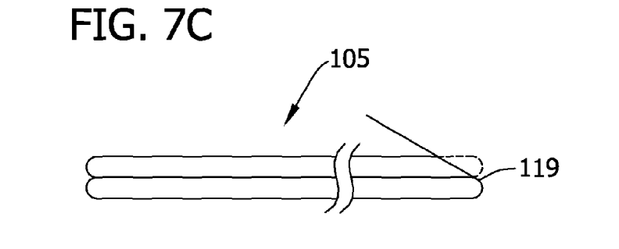
Figure 7D:
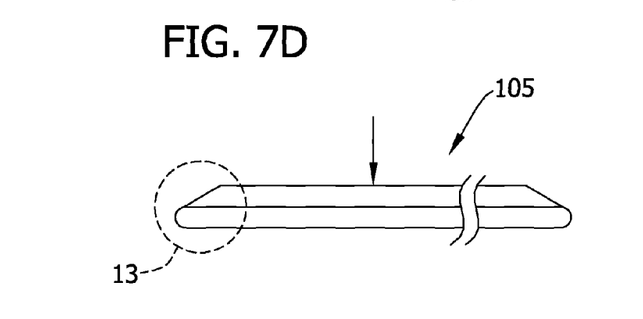
Figure 7E:
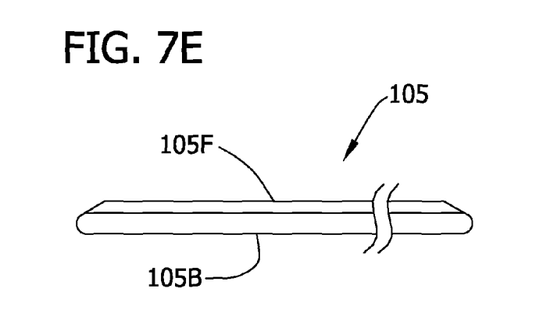
Figure 13:
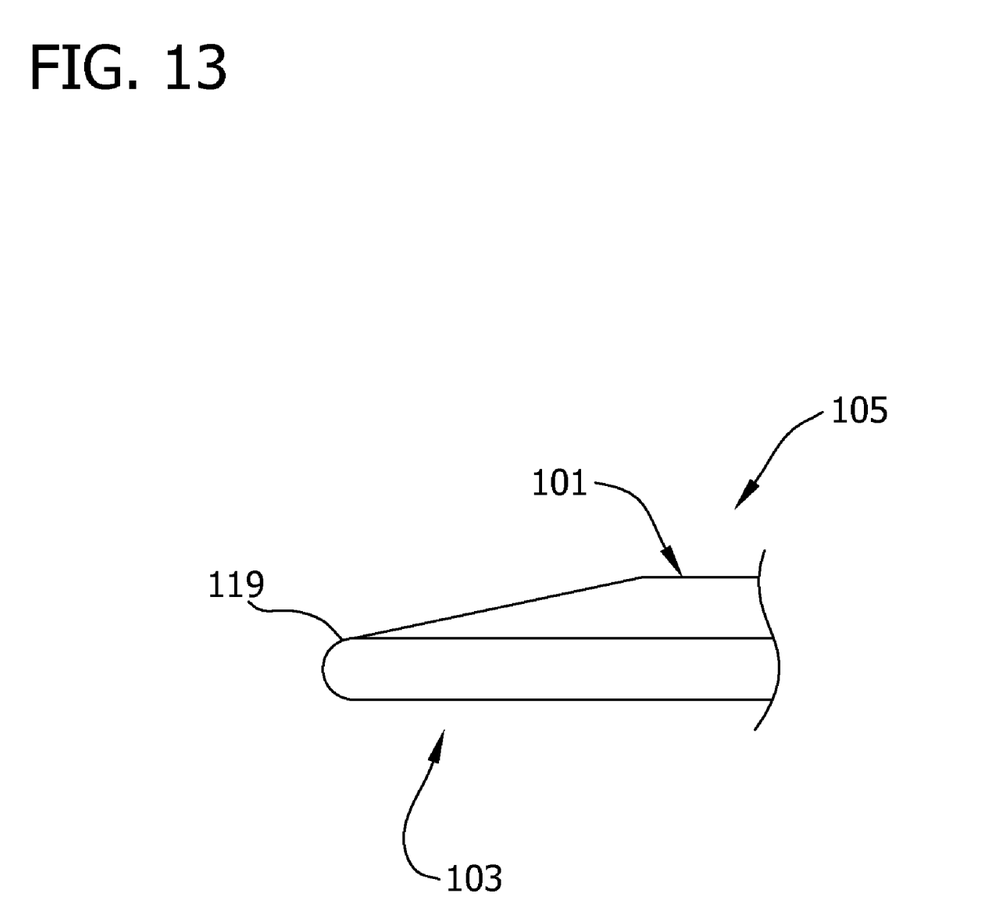
FIG. 13 is an enlarged view of an SOI wafer after trapezoid grinding.

As can be seen from FIGS. 7E and 13, the finished or bonded wafer 105 has an upper portion having a trapezoid shape. More specifically, the upper portion including the remainder of the active layer wafer 101 and a relatively small portion of the substrate wafer is angled at the outer peripheral edge portion so that the wafer is said to have a trapezoid shape or a trapezoid shape in cross-section. Note the lower portion of the bonded wafer 105 (which corresponds substantially to the substrate wafer 103 in this embodiment) has a conventional bevel or rounded shape (broadly, a curved shape) at its outer peripheral edge and thus does not have a trapezoid shape. The upper portion of the bonded wafer 105 is substantially coincident with the active wafer 101 in this embodiment.

Referring again to FIG. 7C, an outer peripheral edge of the active wafer 101 is brought into contact with the grinding wheel and is ground at an angle relative to the front surface 105F of the bonded wafer 105. The angle is suitably between about 3° and 10°, and in this embodiment the angle is about 7°. The edge grinding is performed until the entire outer peripheral edge is ground as shown in FIG. 7D. The grinding eliminates any notch in the outer peripheral edge. The grinding may suitably be done such that the length of the angled or sloped portion is between about 1 mm and 1.5 mm, e.g. about 1.25 mm. Note that the angle and depth of grind is such that a small portion of the top bevel 119 of the substrate wafer 103 is removed during the trapezoid grinding.

In FIG. 7C, the surface of the active wafer 101 is ground until it has a thickness of 40-50 microns, as shown in FIG. 7D. Note the trapezoid shape of the active wafer 101 in FIG. 7D. Also, the edge grind is performed such that a portion of the substrate wafer 103 is ground.

Figure 8:
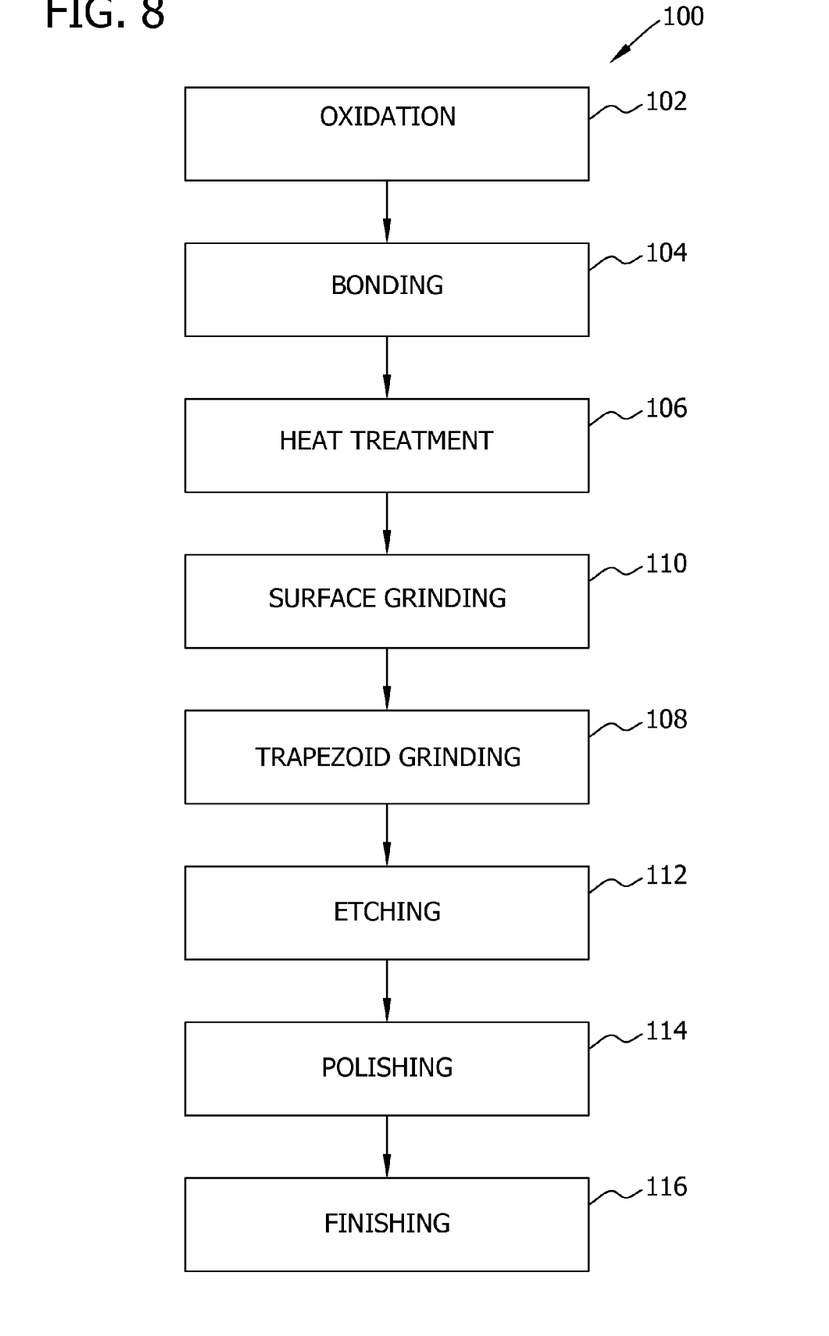
FIG. 8 is a flowchart showing a method of manufacturing an SOI wafer according to another embodiment.
Figure 9A:
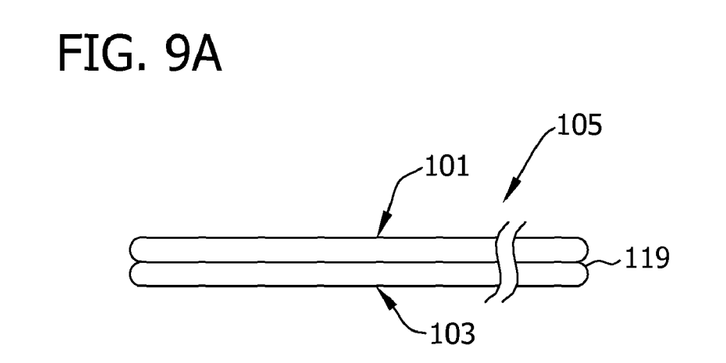
FIGS. 9A-9D are a progression of side views showing aspects of the method of manufacturing of FIG. 8.
Figure 9B:
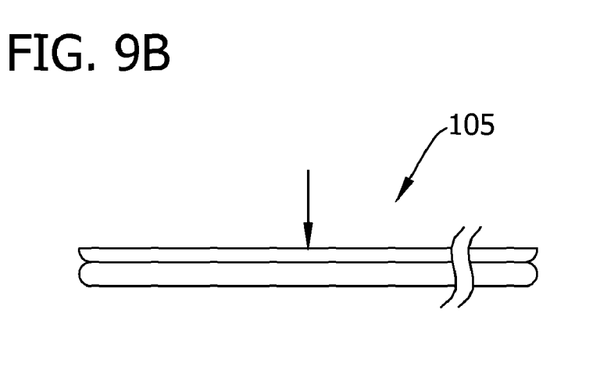
Figure 9C:
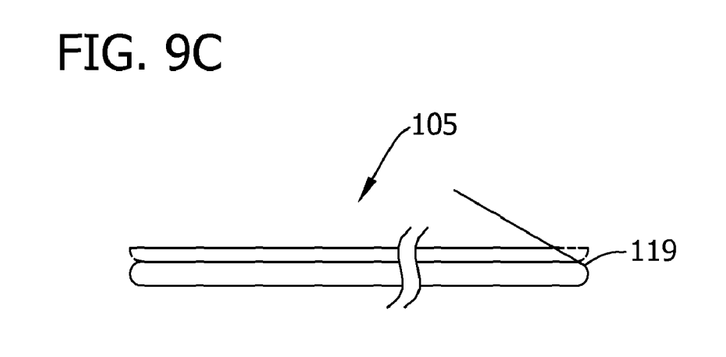
Figure 9D:
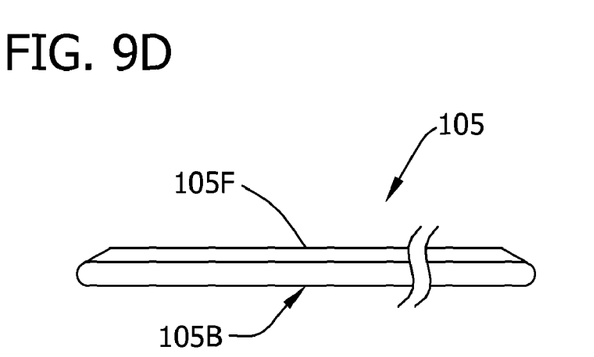

Referring to FIGS. 8 and 9A-9D, the grinding steps are reversed as compared to that of FIGS. 6 and 7A-7D. In other words, the surface of the active wafer 101 is ground first, before the trapezoid grinding. This order of steps is shown in FIG. 8. Again, the surface grinding step may include a rough grinding step and a fine grinding step. Rough grinding is suitably performed using a 600 mesh and grit size of 20 to 30 microns, and fine grinding is 3000 mesh and grit size of 2 to 6 microns. The surface is ground as shown in FIG. 9B, and then the edge of the active wafer 101 is next ground in FIG. 9C until the edges have the trapezoid shape shown in FIG. 9D.

Figure 10:
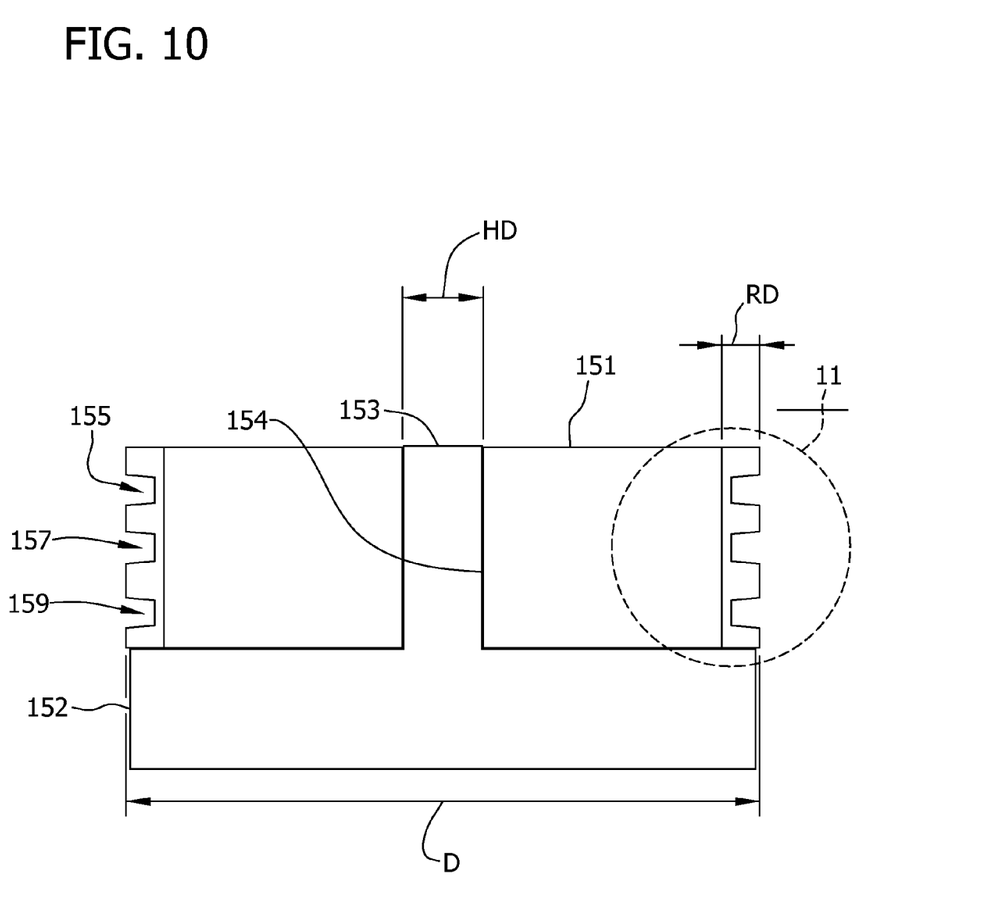
FIGS. 10 and 11 show a grinding wheel of one embodiment for performing a trapezoid grinding step.
Figure 11:
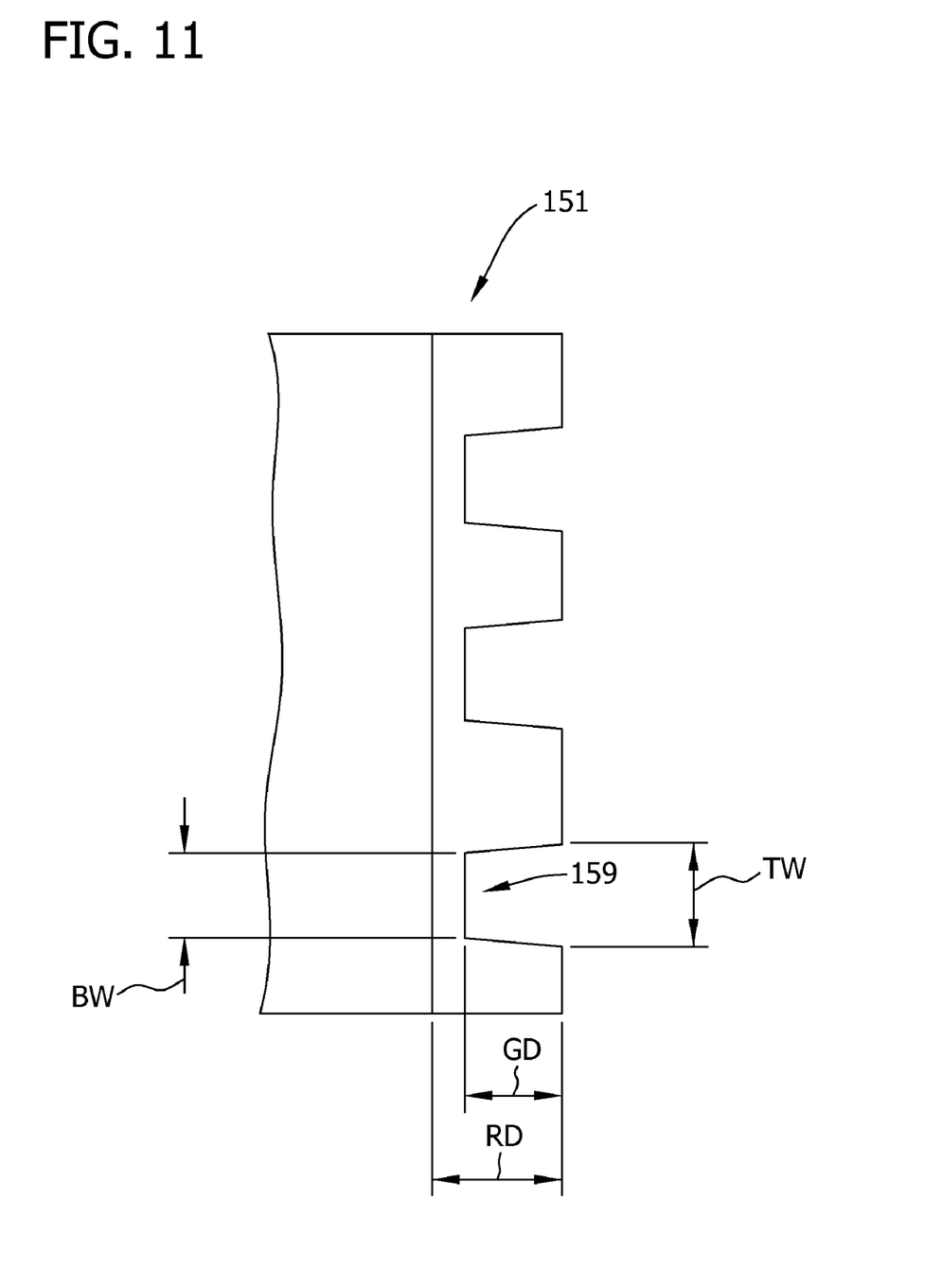

Referring to FIGS. 10 and 11, a grinding wheel 151 (broadly, a trapezoid grinding tool) of one embodiment is designed for the performance of the trapezoid grinding 108. The wheel 151 is adapted to be mounted on a conventional edge profiling machine 152 that performs the trapezoid grinding. In this embodiment, the profiling machine is an STC EP-5800RHO machine adapted for 200 mm diameter wafers. The wheel 151 is mounted on a spindle 153 of the profiling machine 152.

The wheel 151 of this embodiment is ring-shaped or annular and has a central hole 154 adapted for mounting the wheel on the on the spindle 151 of the profiling machine 152. The wheel 151 has a diameter D of 202 mm with a central hole diameter HD of 30 mm and thickness of 20 mm. The wheel 151 of this embodiment has an upper groove 155, a central groove 157 and a lower groove 159 disposed at an outer edge of the wheel. The grooves 155, 157, 159 are generally V-shaped in this embodiment. Note that the wheel 151 may alternatively have just one groove, or practically any other number of grooves, within the scope of this disclosure.

In this embodiment, the upper and central grooves 155, 157 are adapted for fine grinding, and the lower groove 159 is adapted for rough grinding. Each groove suitably includes diamond grits. For fine grinding, diamond grit size of 2000 or 3000 mesh is suitable. For rough grinding, 600 mesh or 800 mesh is suitable. The wheel 151 is suitably made of metal alloy, aluminum alloy, or stainless steel, though other materials are contemplated.

Each groove wall of this embodiment slopes from a bottom of the groove to a top of the groove and has a flat bottom. In this embodiment, the slope is at about a 7° angle. The width of the bottom of the groove is about 1.8 mm for use with a bonded wafer having a total thickness of about 200 mm, so that the substrate wafer or back surface of the wafer is not in contact with the groove during trapezoid grinding. The width of each groove at its widest portion (the top of the groove) is about 3.5 mm. The wall of the groove curves into the bottom of the groove at a radius of about 0.2 mm. The groove depth GD is about 6.0 mm and the groove root depth RD is about 8.0 mm.

Figure 12:
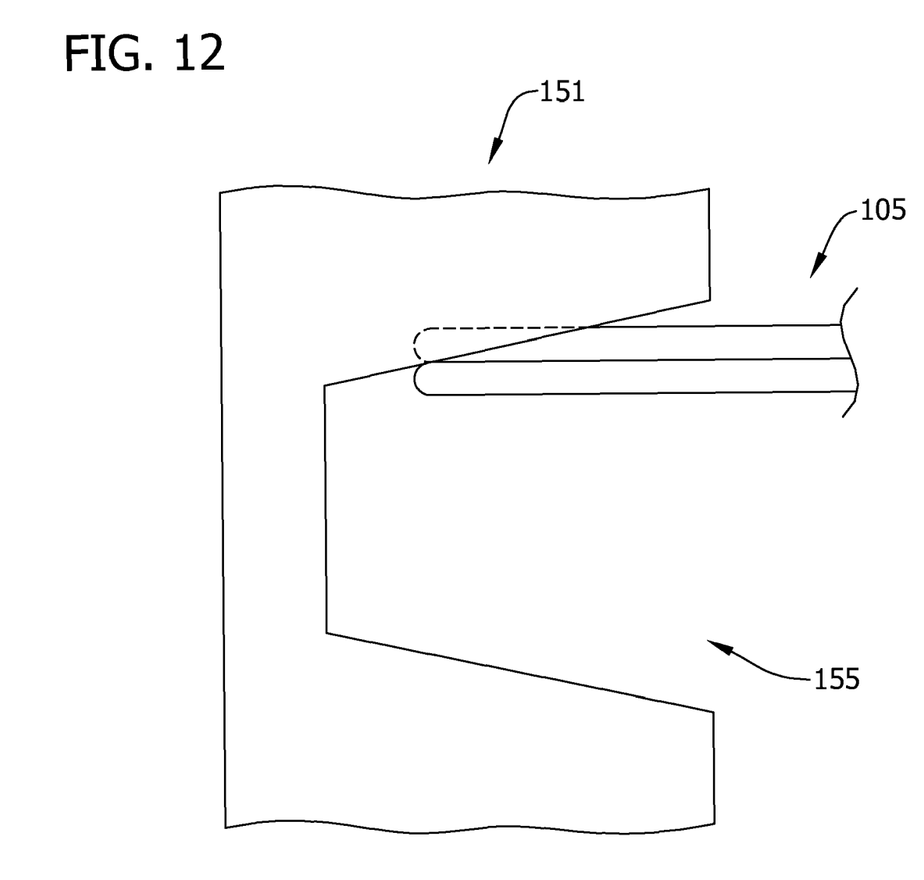
FIG. 12 is a side view of an SOI wafer aligned with a groove of the grinding wheel of FIG. 10.

The wheel 151 is installed on the edge profiling machine 152, such as on a spindle of the STC EP-5800 RHO. After wheel installation, spindle height (vertical direction) and distance (horizontal direction) are fine adjusted, so that groove 155 of the wheel 151 and the bonded wafer 105 are aligned as shown in FIG. 12. Note that the outermost portion of substrate wafer edge and the bottom surface are not in contact with the grinding groove 155. Then, trapezoid grinding is performed as described above. Trapezoid grinding can be performed with either rough grit groove or fine grit groove or both grit grooves (first rough grit groove, then fine grit groove). The grinding may be performed as a single pass or multiple pass process, depending, for example, on edge quality requirements.

The above example methods are applied to remove the unbonded outer peripheral parts of an active layer wafer bonded on a substrate wafer. This results in a bonded wafer having a more securely bonded outer peripheral portion. In a suitable method, after bonding of an active layer wafer onto a support substrate and post-bond heat treat of the bonded pairs, trapezoid grinding is applied to remove the unbonded outer peripheral portion of the active layer wafer. An edge grinding wheel such as wheel 151 may be used to perform the trapezoid grinding step. Among other advantages, the bonded wafer according to embodiments of this disclosure is less likely to suffer delamination. Additionally, the bonded wafer inhibits or prevents particle contamination that might otherwise occur due to delaminated unbonded portions on the process/device lines of the wafer.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description and shown in the accompanying drawing[s] shall be interpreted as illustrative and not in a limiting sense.

What is claimed is:

1. A silicon-on-insulator wafer including a first wafer and a second wafer, the silicon-on-insulator wafer comprising: an upper portion including the first wafer and a portion of the second wafer, the upper portion having an angled outer peripheral edge defining a trapezoid shape in cross-section of the upper portion; and a lower portion including the second wafer and having a curved outer peripheral edge defining a curved shape in cross-section of the lower portion, wherein a bottom surface of the upper portion coincides with a top surface of the lower portion.

2. The silicon-on-insulator wafer of claim 1 wherein the silicon-on-insulator wafer includes an active wafer as the first wafer and a substrate wafer as the second wafer.

3. The silicon-on-insulator wafer of claim 2 wherein the active wafer and substrate wafer are both made of silicon.

4. The silicon-on-insulator wafer of claim 2 wherein the upper portion is substantially coincident with the active wafer and a portion of the substrate wafer.

5. The silicon-on-insulator wafer of claim 4 wherein the upper portion includes an upper peripheral edge of the substrate wafer, the trapezoid shape defined at its lowermost portion by the upper peripheral edge of the substrate wafer.

6. The silicon-on-insulator wafer of claim 5 further comprising an oxide layer disposed between the active wafer and the substrate wafer.

7. The silicon-on-insulator wafer of claim 2 wherein the substrate wafer has only a partially trapezoid shape in cross-section, a remainder of the cross-section of the substrate wafer having the curved shape.

8. A silicon-on-insulator structure comprising: an active wafer having a peripheral edge defining a trapezoidal cross-sectional shape of the active wafer; and a substrate wafer having an upper peripheral edge that has a trapezoid shape in cross-section and an outer peripheral edge having a curved shape, the active wafer and a trapezoidal-shaped portion of the substrate wafer forming an upper portion and a curved-shaped portion of the substrate wafer forming a lower portion, wherein a bottom surface of the upper portion coincides with a top surface of the lower portion.

9. The silicon-on-insulator structure of claim 8 wherein the active wafer and substrate wafer are both made of silicon.

10. The silicon-on-insulator structure of claim 8 wherein the upper peripheral edge of the substrate wafer is substantially co-planar with the peripheral edge of the active wafer to define a lowermost portion of a trapezoid shape of the silicon-on-insulator structure.

11. The silicon-on-insulator structure of claim 10 wherein the upper portion is substantially coincident with the active wafer.

12. The silicon-on-insulator structure of claim 11 wherein the upper portion includes an upper peripheral edge of the substrate wafer, the trapezoid shape of the silicon-on-insulator structure defined at its lowermost portion by the upper peripheral edge of the substrate wafer.

13. The silicon-on-insulator structure of claim 12 further comprising an oxide layer disposed between the active wafer and the substrate wafer.

14. The silicon-on-insulator structure of claim 13 wherein the substrate wafer has only a partially trapezoid shape in cross-section, a remainder of the cross-section of the substrate wafer having the curved shape.

15. A bonded semiconductor wafer comprising an active wafer and a substrate wafer bonded to one another, the bonded semiconductor wafer partially having a trapezoid shape in cross-section, the active wafer including an outer peripheral edge including an angled shape such that the active wafer has the trapezoid shape in cross-section, an upper peripheral edge of the substrate wafer defining a lowermost portion of the trapezoid shape of the bonded semiconductor wafer, the trapezoid shape of the bonded semiconductor wafer defining an upper portion of the bonded semiconductor wafer, and an outer peripheral edge of the substrate wafer defining a curved cross-sectional shape of a lower portion of the bonded semiconductor wafer, wherein a bottom surface of the upper portion coincides with a top surface of the lower portion.

16. The bonded semiconductor wafer of claim 15 wherein the active wafer and substrate wafer are both made of silicon.

17. The bonded semiconductor wafer of claim 15 wherein the outer peripheral edge of the substrate wafer has a curved shape in cross-section positioned below the trapezoid shape.

18. The bonded semiconductor wafer of claim 17 wherein the upper portion of the bonded semiconductor wafer is substantially coincident with the active wafer.

19. The bonded semiconductor wafer of claim 18 further comprising an oxide layer disposed between the active wafer and the substrate wafer.

* * * * *